United States Patent [19]
Sakemi et al.

[11] Patent Number: 5,655,704
[45] Date of Patent: Aug. 12, 1997

[54] METHOD AND APPARATUS FOR MOUNTING SOLDERING BALLS ONTO ELECTRODES OF A SUBSTRATE OR A COMPARABLE ELECTRONIC COMPONENT

[75] Inventors: Shoji Sakemi, Fukuoka; Teruaki Nishinaka, Kasuga, both of Japan

[73] Assignee: Matsushita Electric Industrial Co., Ltd., Osaka, Japan

[21] Appl. No.: 520,284

[22] Filed: Aug. 28, 1995

[30] Foreign Application Priority Data

Aug. 30, 1994 [JP] Japan ............... 6-205106

[51] Int. Cl.$^6$ .................................................. B23K 1/20
[52] U.S. Cl. ................................... 228/246; 228/41
[58] Field of Search .......................... 228/246, 180.22, 228/41; 118/213

[56] References Cited

U.S. PATENT DOCUMENTS

| | | | |
|---|---|---|---|
| 5,324,569 | 6/1994 | Nagesh et al. | 228/246 X |
| 5,431,332 | 7/1995 | Kirby et al. | 228/246 |

*Primary Examiner*—Kenneth J. Ramsey
*Attorney, Agent, or Firm*—Lowe, Price, LeBlanc & Becker

[57] ABSTRACT

A soldering ball mounting apparatus comprises a workpiece positioning mechanism "A" for positioning a workpiece 2 at a predetermined position. The workpiece 2 has an upper face formed with a plurality of electrodes 2a on which soldering balls 3 are mounted. A template 4, provided with a plurality of through holes 4a corresponding to the electrodes 2a in a one-to-one relationship, is supportable in such a manner that their through holes 4a are positioned just above the corresponding electrodes 2a of the workpiece 2. A soldering ball container 12 is provided on the template 4 for accommodating soldering balls 3 therein. The soldering ball container 12 has an open bottom allowing the soldering balls 3 to fall below the template 4 via the through holes 4a. A pair of X and Y motors shifts the soldering ball container 12 along the upper surface of the template 4 disposed in a horizontal direction.

11 Claims, 3 Drawing Sheets

METHOD AND APPARATUS FOR MOUNTING SOLDERING BALLS ONTO ELECTRODES OF A SUBSTRATE OR A COMPARABLE ELECTRONIC COMPONENT

BACKGROUND OF THE INVENTION

1. Field of the Invention

This invention generally relates to a method and an apparatus for mounting soldering balls onto corresponding electrodes provided on an upper surface of a workpiece, such as a substrate or a comparable electronic component.

2. Prior Art

In the field of fine electronic component mounting methods and apparatuses, recently developed is a technology of utilizing soldering balls for forming terminals or connecting the same on a substrate or a comparable electronic component. One typical technology for shifting and mounting such soldering balls onto electrodes includes steps of providing an absorber head having a plurality of absorbing holes as much as the electrodes of a workpiece to be processed, absorbing soldering balls from a ball reservoir at the absorbing holes of the absorber head, and transporting and mounting the absorbed soldering balls onto the workpiece by shifting the absorber head.

However, the above method is disadvantageous in that some of the soldering balls may be accidentally trapped so deeply in the absorbing holes that these soldering balls are no longer disengaged from the absorbing heads because each soldering ball is too soft to prevent deformation when it is absorbed into the absorbing hole under a significant suction pressure.

SUMMARY OF THE INVENTION

Accordingly, in view of above-described problems encountered in the prior art, a principal object of the present invention is to provide a soldering ball mounting apparatus and method for surely mounting soldering balls onto electrodes of a workpiece without causing any failure in the mounting operation.

In order to accomplish this and other related objects, a first aspect of the present invention provides a soldering ball mounting apparatus comprising: a workpiece positioning mechanism for positioning a workpiece at a predetermined position, the workpiece having an upper face formed with a plurality of electrodes on which soldering balls are mounted from an upside of the workpiece; a template having a plurality of through holes corresponding to the electrodes in a one-to-one relationship, the template being supportable in such a manner that the through holes are positioned just above the corresponding electrodes of the workpiece; a soldering ball container provided on the template for accommodating soldering balls therein, the soldering ball container having an open bottom allowing the soldering balls to fall below the template via the through holes; and a shifting mechanism for shifting the soldering ball container along an upper surface of the template horizontally disposed.

A second aspect of the present invention provides a soldering ball mounting apparatus for mounting a plurality of soldering balls onto a plurality of electrodes of a workpiece, the apparatus comprising: a template comprising a mounting area and a standby area provided separately on an upper surface thereof, the mounting area having a plurality of through holes corresponding to the plural electrodes, each through hole allowing only one soldering ball to enter, and the standby area having no through holes; a soldering ball container provided on the template for accommodating soldering balls therein, the soldering ball container having an open bottom allowing the soldering balls to fall below the template via the through holes; a shifting mechanism for shifting the soldering ball container from the standby area to the mounting area along the upper surface of the template horizontally disposed; and a workpiece positioning mechanism for positioning and supporting the workpiece under the template so that the electrodes of the workpiece meet corresponding through holes of the template.

In the above first or second aspect soldering ball mounting apparatus, it is preferable that said workpiece positioning mechanism moves the workpiece in both horizontal and vertical directions with respect to the template.

Furthermore, it is desirable that the above soldering ball mounting apparatus comprises a soldering ball supply device for supplying soldering balls into the soldering ball container.

A third aspect of the present invention provides a soldering ball mounting method for mounting a plurality of soldering balls onto a plurality of electrodes of a workpiece, the method comprising steps of: positioning and supporting the workpiece under a template having a plurality of through holes, each through hole allowing only one soldering ball to enter, so that the electrodes of the workpiece meet corresponding through holes of the template; rolling the soldering balls along an upper surface of the template so as to drop the soldering balls from the through holes one by one, thereby mounting the soldering balls on the electrodes of the workpiece; and causing a mutual displacement in a vertical direction between the template and the workpiece, so that the soldering balls mounted on the electrodes of the workpiece are removed out of the through holes of the template.

In the above soldering ball mounting method, it is desirable that flux is applied on the electrodes of the workpiece beforehand. Furthermore, it is desirable that the soldering balls are accommodated in a soldering ball container movable along the upper surface of the template with an open bottom, and the soldering balls are dropped from the through holes of the template by sliding the soldering ball container on the upper surface of the template.

Moreover, a fourth aspect of the present invention provides a soldering ball mounting method for mounting a plurality of soldering balls onto a plurality of electrodes of a workpiece, the method comprising steps of: positioning and supporting the workpiece under a template having a plurality of through holes, each through hole allowing only one soldering ball to enter, so that the electrodes of the workpiece meet corresponding through holes of the template, the template comprising a mounting area and a standby area provided separately on an upper surface thereof, the mounting area being provided with the plural through holes corresponding to the plural electrodes while the standby area having no through holes; storing the soldering balls into a soldering ball container movable along the upper surface of the template with an open bottom, and sliding the soldering ball container in the mounting area of the upper surface of the template so as to drop the soldering balls from the through holes, thereby mounting the soldering balls on the electrodes of the workpiece; shifting the soldering ball container to the standby area; and causing a mutual displacement in a vertical direction between the template and the workpiece, so that the soldering balls mounted on the electrodes of the workpiece are removed out of the through holes of the template.

In the above soldering ball mounting method, it is also preferable that flux is applied on the electrodes of the workpiece beforehand, and, the soldering balls are supplied when the soldering ball container is in the standby area.

With above arrangements, each soldering ball falls down into a through hole by free fall when the soldering ball container slides along the upper surface of the template. As the layout of the through holes correctly coincides with the arrangement of electrodes of a workpiece, each soldering ball is surely mounted on each electrode upon falling into each through hole. Furthermore, as the diameter of each soldering ball is smaller than that of each through hole, no special external force such as an absorbing force is applied to each soldering ball. Thus, no deformation of soldering balls and no failure of the mounting operation will be assured.

BRIEF DESCRIPTION OF THE DRAWINGS

The above and other objects, features and advantages of the present invention will become more apparent from the following detailed description which is to be read in conjunction with the accompanying drawings, in which.

DETAILED DESCRIPTION OF THE PREFERRED EMBODIMENT

Figure 1:
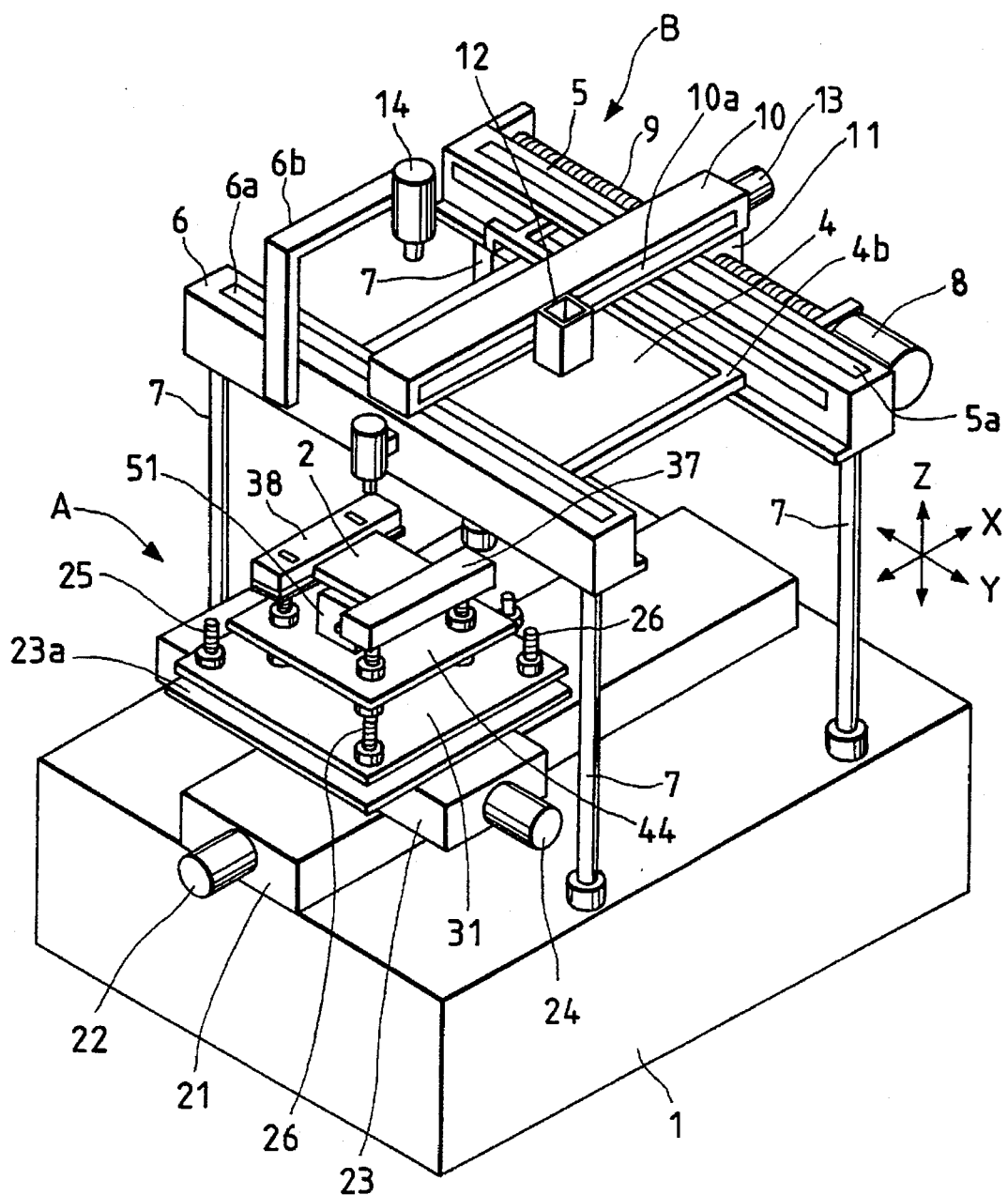
FIG. 1 is a perspective view showing a soldering ball mounting apparatus in accordance with one embodiment of the present invention.

A preferred embodiment of the present invention will be explained in greater detail hereinafter, with reference to the accompanying drawings. Identical parts are denoted by an identical reference numeral throughout views.

In FIG. 1, reference numeral 1 represents a base body, and reference letter "A" represents a workpiece positioning mechanism for positioning a workpiece 2 such as a substrate or a comparable electronic component. Details of the workpiece positioning mechanism "A" will be explained in more detail with reference to FIG. 2. In FIG. 3, reference numeral 4 represents a template which is a thin plate with a plurality of through holes 4a opened therethrough in a thickness direction, each through hole 4a having a diameter larger than that of a soldering ball 3 so as to allow each soldering ball 3 to pass any through hole 4a by free fall.

These through holes 4a are gathered into some groups. An arrangement of each group has a one-to-one relationship with the arrangement of electrodes on the workpiece 2 on which soldering balls 3 are mounted. Reference numeral 4b is a frame for retaining the periphery of the template 4. The template 4 is roughly constituted by two areas, a mounting area 4d provided centrally thereof and a standby area 4c offset from the mounting area 4d.

In FIG. 1, reference letter "B" represents a template holding mechanism for securely supporting the template 4. The template holding mechanism "B" comprises a pair of template guides 5 and 6 disposed in parallel with each other and extending in the Y direction. Both ends of each template guide 5 or 6 are supported by vertically standing shafts 7, 7 fixed on the base body 1 at the lower ends thereof.

These template guides 5 and 6 cooperatively support the template frame 4b from the downside thereof and rigidly fix the template frame 4b, i.e. template 4, from the side thereof by means of an appropriate clamping mechanism (not shown).

One template guide 5 has a feed screw 9 extending in the Y direction, which is rotated by a Y motor 8. The feed screw 9 is engaged with a feed nut 11 connected integrally with a transportation frame 10 extending in the X direction. Both ends of the transportation frame 10 are engaged with grooves 5a and 6a formed on the template guides 5 and 6, so that the transportation frame 10 is slidable in the Y direction.

Reference numeral 12 represents a soldering ball container which stores soldering balls 3 therein. The soldering ball container 12, cylindrical and having an open top and an open bottom, is engaged with a groove 10a formed on the side face of the transportation frame 10 so as to be slidable in the X direction. Reference numeral 13 represents an X motor for shifting the soldering ball container 12 in the X direction with respect to the transportation frame 10. A soldering ball supply tank 14, supplying soldering ball 3 into the soldering ball container 12, is fixedly supported on a distal end of a bent arm 6b extending in a cantilever manner from the template guide 6.

To prevent each soldering ball 3 from going out of the soldering ball container 12, the soldering ball container 12 is directly placed on the upper surface of the template 4, or in positioned above the same with a slight gap smaller than the diameter of the solder ball 3 in the event that any clearance is provided between the bottom surface of the soldering ball container 12 and the upper surface of the template 4.

Accordingly, driving both the Y motor 8 and the X motor 13 together makes it possible to flexibly move the soldering ball container 12 along the upper surface of the template 4 (i.e. an X-Y plane). More specifically, the soldering ball container 12 is first positioned under the soldering ball supply tank 14, allowing the soldering ball supply tank 14 to supply soldering balls 3 into the soldering ball container 12. Thereafter, the soldering ball container 12 is shifted horizontally along the surface of the template 4 in a circular or spiral manner as indicated by an arrow in FIG. 3. In this manner, the Y motor 8 and the X motor 13 cooperatively act as shifting means for moving the soldering ball container 12 along the upper surface of the template 4.

Figure 3:
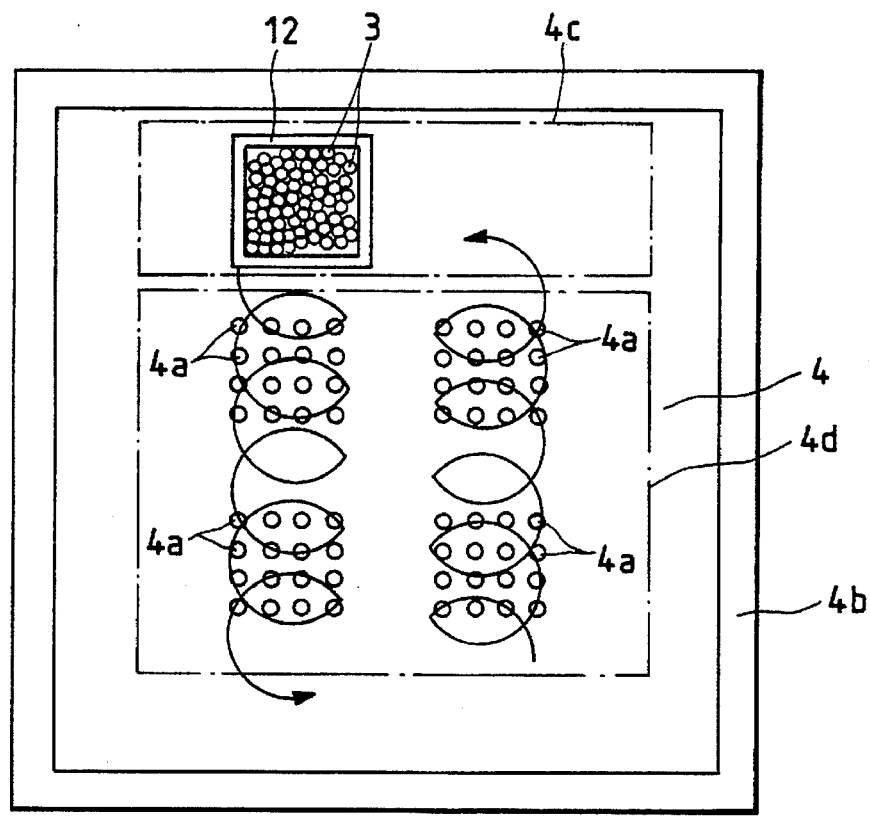
FIG. 3 is a plan view showing the soldering ball mounting apparatus in accordance with the embodiment of the present invention.
Figure 4:
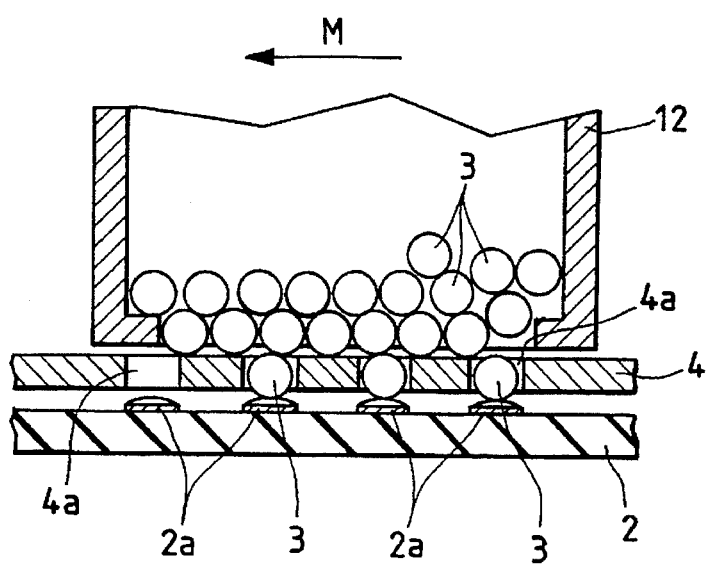
FIG. 4 is a partly enlarged cross-sectional view showing the soldering ball mounting apparatus in accordance with the embodiment of the present invention.

When the soldering ball container 12 is horizontally moved in the mounting area 4d of the template 4 as shown by the arrow in FIG. 3, the soldering balls 3 in the soldering ball container 12 roll on the template 4 and fall in the through holes 4a, thereby mounting each soldering ball 3 on the electrode 2a of the workpiece 2 one by one as shown in FIG. 4, wherein reference letter "M" represents a moving direction of the soldering ball container 12. Flux is applied beforehand on the top of each electrode 2a on the workpiece 2.

Figure 2:
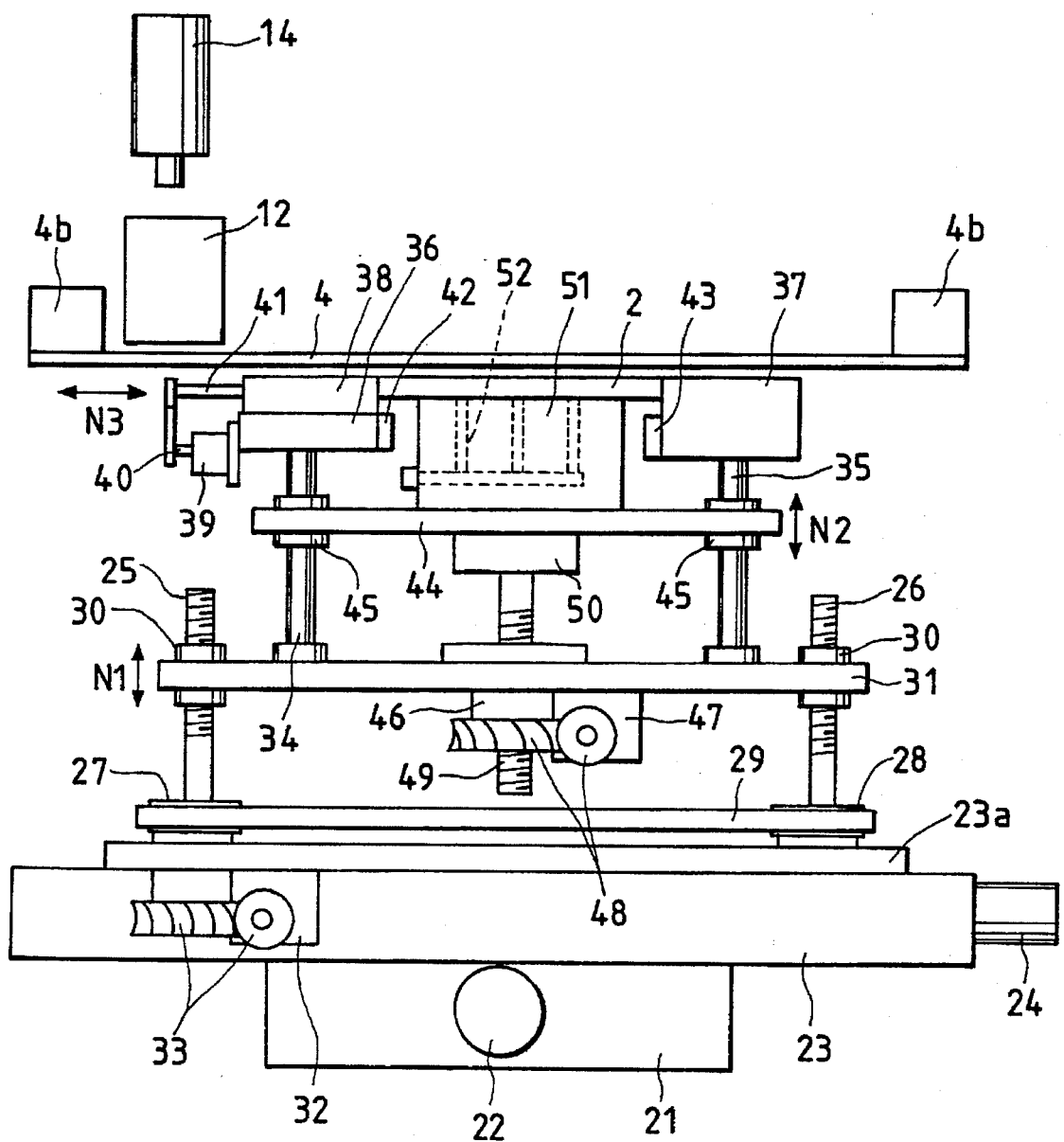
FIG. 2 is a front view showing the soldering ball mounting apparatus in accordance with the embodiment of the present invention.

With reference to FIG. 2, the workpiece positioning mechanism "A" will be explained in more detail. In FIG. 2, reference numeral 21 represents an X table mounted on the base body 1 and driven by an X motor 22. Reference numeral 23 represents a Y table mounted on the X table and driven by a Y motor 24. Reference numeral 25 represents a first feed screw rotatably engaged and supported by a plate 23a provided on the Y table 23. Reference numeral 28 represents a second feed screw rotatably engaged and supported by the plate 23a. The first and second feed screws 25 and 28, extending in a vertical direction, have lower portions provided with timing pulley 27 and 28, respectively. An endless timing belt 29 is entrained between these timing pulleys 27 and 28. Each of the first and second feed screws 25 and 28 has an upper portion screwed into a nut 30 rotatably supported to a first elevating plate 31.

Furthermore, a first Z motor 32 is fixed on the lower face of the plate 23a. The rotational force of the first Z motor 32 is transmitted to the first feed screw 25 by way of a gear train 33. When the first feed screw 25 is rotated, the second feed screw 28 is synchronously rotated by means of the timing belt 29 entrained between the timing pulleys 27 and 28. Hence, the first elevating plate 31 is moved in the vertical direction as shown by an arrow N1, with keeping its horizontal attitude.

Elevating guides 34 and 35 stand on the first elevating plate 31. The elevating guide 34 has an upper end fixed to a first block 36. Similarly, the elevating guide 35 has an upper end fixed to a second block 37. A clamper 38 is provided on the first block 26 so as to be slidable in a direction of an arrow N3. The upper face of the clamper 38 and the upper face of the second block 37 are positioned at the same height so as to cooperatively act as support means for receiving the bottom of the template 4.

A slide cylinder 39 is fixed on the left face of the first block 36, with a rod 40 protruding leftward from the body of the slide cylinder 39. The front end of the rod 40 is connected to the left end of the clamper 38 via an appropriate linking mechanism 41. Thus, when the slide cylinder 39 is driven to protrude and retract the rod 40 in a right-and-left direction, the clamper 38 can shift in a direction of an arrow N3. With this shifting movement of the clamper 38, the workpiece 2 interposed between the clamper 38 and the second block 37 can be clamped firmly at the opposite sides thereof. A pair of conveyors 42 and 43 are provided on the confronting faces of the first and second blocks 36 and 37, for transporting the workpiece 2 in a direction perpendicular to the paper face of FIG. 2 drawing.

The elevating guides 34 and 35 cooperatively guide a second elevating plate 44 via bearings 45 in a direction of an arrow N2. A feed nut 46 is rotatably supported on the first elevating plate 31. A second Z motor 47 is fixed to the lower face of the first elevating plate 31. The rotational force of the second Z motor 47 is transmitted to the feed nut 46 via a gear train 48. A third feed screw 49, screwed into the feed nut 46, extends vertically and has an upper portion rotatably supported by the second elevating plate 44 via a bearing 50.

An absorber block 51 is fixed on the upper face of the second elevating plate 44 so as to be positioned just beneath the workpiece 2. The absorber block 51 includes absorber pipes 52 for absorbing the lower face of the workpiece 2 by vacuum or the like. Accordingly, when the second Z motor 47 is actuated, the feed nut 46 and the third feed screw 49 are integrally rotated via the gear train 48, thereby elevating or lowering the second elevating plate 44 and the absorber block 51 with respect to the first elevating plate 31 in the direction of the arrow N2. On the other hand, when the mounting operation of the soldering balls 3 is finished, the first Z motor 32 is actuated to lower the workpiece 2 and transport the same.

Next, an operation of the soldering ball mounting apparatus in accordance with the embodiment of the present invention will be explained.

First of all, the workpiece 2 is received by the conveyors 42 and 43 of the workpiece positioning mechanism "A".

Then, the absorber block 51 is raised upward until it is brought into contact with the lower face of the workpiece 2, thereafter adjusting the height of the upper face of the workpiece 2. Next, the clamper 38 is shifted toward the second block 37, so as to firmly clamp the workpiece 2 between the clamper 38 and the second block 37. In turn, the workpiece 2 is absorbed by the absorber block 51.

Then, the X motor 22 and the Y motor 24 are driven together to move the workpiece 2 along the lower face of the template 4 until all the electrodes of the workpiece 2 completely meet the corresponding through holes 4a. After finishing the horizontal positioning operation of the workpiece 2, the first Z motor 32 is driven to raise the workpiece 2 until the workpiece 2 is almost brought into contact with the bottom of the template 4.

Then, the soldering ball container 12 is moved along the surface of the mounting area 4d with a spiral motion. The soldering balls 3 in the soldering ball container 12 roll on the surface of the template 4 and fall into through holes 4a by free fall one by one. Thus, the electrodes 2a of the workpiece 2 positioned under the template 4 can receive soldering balls 3 thereon. In this case, each electrode 2a catches the soldering ball 3 by an adhesion force given by the flux coated beforehand on the electrode 2a. In this manner, the adhesion force of the flux prevents the soldering ball 3 from dislocating from the electrode 2a.

After all the through holes 4a are filled with the soldering balls 3, the soldering ball container 12 is shifted back to the standby area 4c. Then, the first Z motor 32 is driven to lower the workpiece 2. Accordingly, the soldering balls mounted on the electrodes 2a are removed out of the through holes 4a of the template 4. Subsequently, the clamper 38 is shifted leftward so as to release the clamping condition of the workpiece 2 and the absorber block 51 is deactivated to release the absorbing condition of the workpiece 2. After that, the workpiece 2 mounting the soldering balls 3 on the electrodes 2a thereof is taken out and transported to the following step. i.e. a reflow step, by the conveyors 42 and 43.

The soldering balls 3 are heated and melted in the reflow step, and subsequently cooled down to harden the molten solder so as to form a solder bump on each electrode 2a.

By repeating the above procedure, the mounting operation of the soldering balls 3 onto the workpiece 2 is continuously performed. Meanwhile, the amount of soldering balls 3 in the soldering ball container 12 is gradually reduced. Thus, the soldering balls 3 are newly added into the soldering ball container 12 from the soldering ball supply tank 14 positioned above the standby area 4c. The residual amount of the soldering balls 3 can be detected by providing an appropriate sensor in the soldering ball container 12, or can be known from the total number of the workpieces 2 having been subjected to the soldering ball mounting operation.

Although the present embodiment moves the workpiece 2 with respect to the stationarily fixed template 4, it is needless to say that the workpiece 2 can be fixed stationarily and the template 4 can be moved with respect to such a stationary workpiece 2. Furthermore, the configuration and operation of the soldering ball container 12 can be modified flexibly.

As explained in the foregoing description, the soldering ball mounting apparatus in accordance with the present invention comprises: a workpiece positioning mechanism for positioning a workpiece at a predetermined position, the workpiece having an upper face formed with a plurality of electrodes on which soldering balls are mounted from an upside of the workpiece; a template having a plurality of through holes corresponding to the electrodes in a one-to-one relationship, the template being supportable in such a manner that the through holes are positioned just above the corresponding electrodes of the workpiece; a soldering ball container provided on the template for accommodating soldering balls therein, the soldering ball container having an open bottom allowing the soldering balls to fall below the template via the through holes; and a shifting mechanism for shifting the soldering ball container along an upper surface of the template horizontally disposed.

Accordingly, each soldering ball falls down into a through hole by free fall without deformation of spherical shape thereof when the soldering ball container slides along the upper surface of the template. As the layout of the through holes perfectly coincides with the arrangement of electrodes on a workpiece, each soldering ball is surely mounted on each electrode upon falling into each through hole. Furthermore, as the diameter of each soldering ball is smaller than that of each through hole, no special external force such as an absorbing force is applied to each soldering ball, thereby assuring no deformation of soldering balls and no failure of the mounting operation.

As this invention may be embodied in several forms without departing from the spirit of essential characteristics thereof, the present embodiment as described is therefore intended to be only illustrative and not restrictive, since the scope of the invention is defined by the appended claims rather than by the description preceding them, and all changes that fall within metes and bounds of the claims, or equivalents of such metes and bounds, are therefore intended to be embraced by the claims.

What is claimed is:

1. A soldering ball mounting apparatus comprising:
   a workpiece positioning mechanism for positioning a workpiece at a predetermined position, said workpiece having an upper face formed with a plurality of electrodes on which soldering balls are mounted from an upside of said workpiece;
   a template having a plurality of through holes corresponding to said electrodes in a one-to-one relationship, said template being supportable in such a manner that said through holes are positioned just above said corresponding electrodes of said workpiece;
   a soldering ball container provided on said template for accommodating soldering balls therein, said soldering ball container having an open bottom allowing the soldering balls to fall below said template via said through holes; and
   a shifting mechanism for shifting said soldering ball container along an upper surface of said template horizontally disposed.

2. The soldering ball mounting apparatus defined by claim 1, wherein said workpiece positioning mechanism moves said workpiece in both horizontal and vertical directions with respect to said template.

3. The soldering ball mounting apparatus defined by claim 1, further comprises a soldering ball supply device for supplying soldering balls into said soldering ball container.

4. A soldering ball mounting apparatus for mounting a plurality of soldering balls onto a plurality of electrodes of a workpiece, said apparatus comprising:
   a template comprising a mounting area and a standby area provided separately on an upper surface thereof, said mounting area having a plurality of through holes corresponding to said plural electrodes of the workpiece, each through hole allowing only one soldering ball to enter, and said standby area having no through holes;
   a soldering ball container provided on said template for accommodating soldering balls therein, said soldering ball container having an open bottom allowing the soldering balls to fall below said template via said through holes;
   a shifting mechanism for shifting said soldering ball container from said standby area to said mounting area along the upper surface of said template horizontally disposed; and
   a workpiece positioning mechanism for positioning and supporting said workpiece under said template so that said electrodes of the workpiece meet corresponding through holes of said template.

5. The soldering ball mounting apparatus defined by claim 4, wherein said workpiece positioning mechanism moves said workpiece in both horizontal and vertical directions with respect to said template.

6. The soldering ball mounting apparatus defined by claim 4, further comprises a soldering ball supply device for supplying soldering balls into said soldering ball container within said standby area.

7. A soldering ball mounting method for mounting a plurality of soldering balls onto a plurality of electrodes of a workpiece, said method comprising steps of:
   positioning and supporting said workpiece under a template having a plurality of through holes, each through hole allowing only one soldering ball to enter, so that said electrodes of the workpiece meet corresponding through holes of said template;
   accommodating said plurality of soldering ball in a soldering ball container having an open bottom and movable along the upper surface of said template and dropping said soldering balls from said through holes of the template by sliding said soldering ball container on an upper surface of the template, thereby mounting said soldering balls on said electrodes of said workpiece; and
   causing a mutual displacement in a vertical direction between said template and said workpiece, so that said soldering balls mounted on said electrodes of the workpiece are removed out of said through holes of the template.

8. The soldering ball mounting method defined by claim 7, wherein flux is applied on said electrodes of the workpiece beforehand.

9. A soldering ball mounting method for mounting a plurality of soldering balls onto a plurality of electrodes of a workpiece, said method comprising steps of:
   positioning and supporting said workpiece under a template having a plurality of through holes, each through hole allowing only one soldering ball to enter, so that said electrodes of the workpiece meet corresponding through holes of said template, said template comprising a mounting area and a standby area provided separately on an upper surface thereof, said mounting area being provided with said plural through holes corresponding to said plural electrodes while said standby area having no through holes;

storing said soldering balls into a soldering ball container movable along the upper surface of said template with an open bottom, and sliding said soldering ball container in said mounting area of the upper surface of said template so as to drop said soldering balls from said through holes, thereby mounting said soldering balls on said electrodes of said workpiece;

shifting said soldering ball container to said standby area; and causing a mutual displacement in a vertical direction between said template and said workpiece, so that said soldering balls mounted on said electrodes of the workpiece are removed out of said through holes of the template.

10. The soldering ball mounting method defined by claim 9, wherein flux is applied on said electrodes of the workpiece beforehand.

11. The soldering ball mounting method defined by claim 9, wherein said soldering balls are supplied when said soldering ball container is in said standby area.

* * * * *